United States Patent [19]

Sakamoto et al.

[11] 4,441,020
[45] Apr. 3, 1984

[54] METHOD FOR TRACING AN OBJECT

[75] Inventors: Takashi Sakamoto; Tetsuo Sano; Eiji Kodama, all of Kyoto, Japan

[73] Assignee: Dainippon Screen Seizo Kabushiki Kaisha, Kyoto, Japan

[21] Appl. No.: 269,952

[22] Filed: Jun. 3, 1981

[30] Foreign Application Priority Data

Jun. 5, 1980 [JP] Japan .................................. 55-75820

[51] Int. Cl.$^3$ ............................................. G05B 1/00
[52] U.S. Cl. .................................... 250/202; 318/577
[58] Field of Search .......................... 250/202; 318/577

[56] References Cited

U.S. PATENT DOCUMENTS 4,160,199  7/1979  Bardwell .............................. 318/577
4,313,073  1/1982  Yamamoto et al. ................. 250/202
4,321,682  3/1982  Koshikawa ......................... 250/202

Primary Examiner—David C. Nelms
Attorney, Agent, or Firm—Daniel M. Rosen

[57] ABSTRACT

A method for tracing an object such as an outline of a picture or a line image, wherein the object is sensed by a set of sensing elements arranged in an optical head moving along the object, to detect a position and a direction of the object, wherein the optical head is controlled to trace the object depending on the detected position and the direction of the object, and wherein the object is reproduced by reproduction means which is moved in synchronization with the optical head. Present invention improves this method by moving the optical head along portions of the object, which the sensing elements can discriminate hardly or not at all nor follow the object, according to line segment data which is predetermined and represent a plurality of points of coordinates.

8 Claims, 18 Drawing Figures

METHOD FOR TRACING AN OBJECT

BACKGROUND OF THE INVENTION

This invention relates to a method for tracing an object such as an outline of a picture or a line image and following it, and in particular, relates to a method for making a mask for photo-copying.

In printing, masks are used in many ways. For example, when a catalog of goods is printed, in most cases it is made up from various photographs of the goods in different settings. Therefore, it is necessary to remove the backgrounds from these photographs before assembling them to form the catalog. Therefore, a reproduction image is obtained by preparing a film of which the necessary part is transparent and the rest opaque, laying this film on the original picture, and reproducing the combination photographically. According to circumstances, on the other hand, it may be desirable to provide such a mask in which the necessary part is opaque, and the rest transparent.

Such a mask has heretofore been made by hand. For example, in the same manner as when tracing a drawing, a transparent film sheet is laid on the original picture, and the outline of the part to be masked is drawn. The outside or the inside of the outline is then blotted out by opaque ink, to obtain the cutting mask.

This kind of hand work presents no problem, if the object to be masked has a simple outline, but if the object to be masked has a complicated, convoluted, or irregular outline, great skill and trouble, and a lot of time, are required. Hence, it is quite difficult to prepare an accurate cutting mask quickly for photographic plate making.

Another method of producing such a cutting mask is to reproduce a photofilm of the desired size, and then to directly obliterate the portion to be blanked off with opaque ink. This method again requires hand work, and suffers from cost and accuracy problems.

Another method has been used for making such a mask, in which a piece of peel-off laminate film made of a colorless transparent film and a colored transparent film which has a safe light color such as red is laid on the original picture, and then the transparent color film is cut along the outline of the object in the picture. The unnecessary part of the transparent color film is then peeled off, to obtain the cutting mask. This method skips over the process of blotting out with opaque ink, but the cutting is done by hand by a thin-bladed cutter, and therefore the outline of the image must still be followed by hand. So this method, too, is tedious, slow, unreliable and inaccurate, and expensive.

An automatic method for preparing such a mask uses an electronic color separation scanner, or a color scanner for plate making. In this case, the background of the object to be masked in the picture is set to a specific color, prior to photographing the picture. This picture is then scanned for color separation by the color scanner, and the specific color of the background is detected and exposed on a recording film to provide the cutting mask. This method is accurate and automatic, but is only applicable to an original picture of which the background has been specifically set to a given color, and cannot be used for an ordinary picture. Further, this method requires the use of a costly color scanner.

In order to remove the disadvantages and inconveniences of the conventional method, another method of tracing an outline has been developed. This method at least partially avoids these aforementioned difficulties, and is adapted to be performed at least partially by machine, so as to relieve the operator of substantial work. This method of control is adapted to be performed by machine, although it does involve some steps best done by an operator, thereby obtaining an accurate mask.

Figure 1:
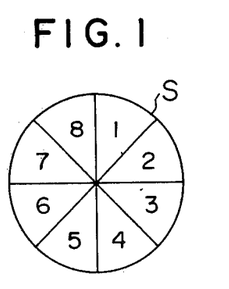
FIG. 1 is a schematic view of a sensor composed of a set of photoelectric detecting elements, which is used to perform a method of the present invention.
Figure 2:
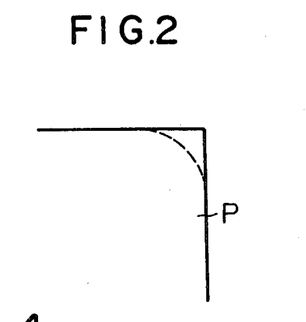
FIG. 2 is a view of an outline with right angle bend in it, and of the error made in tracing it according to a prior art method.

In this embodiment, as shown in FIG. 1, a sensor S which is used to perform a method of the present invention, is composed of a set of eight photoelectric detecting elements spaced around eight sectors of a circle, denoted by "1"–"8", each having substantially the same photoelectric performance. Hence, when the boundary of a picture P to be followed is curved at a right angle as shown in FIG. 2, the sensor S instead follows a curvaceous path, as shown by a broken line in FIG. 2, cutting off the corner. Further, when the area whose outline is to be followed is composed of two or more areas of different light values, then there is a danger that, when the sensor S reaches the division between two of those areas, it may take the wrong path.

In order to remove these disadvantages another method of tracing an outline has been proposed. In this method, the sensor automatically traces an outline of a boundary of different light values within a picture according to signals picked up by the detecting elements, except corner portions of the outline and intersecting portions of the boundaries of the different light values in which the outline is supplementarily traced in a manual manner after the automatic tracing is finished.

However, this method still has problems. For example, when the outline to be traced is largely curved, at least one more point of coordinates for determining the tracing direction in addition to those of the start and the destination points of a line segment to be automatically traced, of the outline should be given, and the sensor may take a wrong path when the light density difference between the picture to be cut out and and the background is small, or when the outline has a detail more than the resolving power of the sensor composed of the photoelectric elements, or when another outline exists near the outline to be traced and confuses therewith.

The method of the present invention constitutes an improvement of the method disclosed in Japanese patent laid-open publication No. 55-7846 (Japanese patent Application No. 53-131195; one of the prior applications of the current applicant). In accordance with the present invention as above discussed, data corresponding to a curve to be followed are previously memorized by coordinate reading means, such as a digitizer table, or the like, in order to enable following the outline of a curve that cannot be followed readily, or followed at all by a sensor. The output of the digitizer table or the like is recorded, the data therefrom being employed, in combination with the output of the sensor, for following the curve to produce a cutting mask.

SUMMARY OF THE INVENTION

It is an object of the present invention to provide a method for tracing an object and following it free from the aforementioned defects, which is accurate, reliable and simple.

According to the present invention there is provided a method for tracing an object wherein the object is sensed by a set of sensing elements included in an optical head which moves along the object, to detect a position and a direction of the object, wherein the optical head is controlled to trace the object depending on the detected position and the direction of the object, and wherein the object is reproduced by reproduction means which is moved in synchronization with the optical head, the improvement comprising the step of moving the optical head along portions of the object, which the sensing elements can hardly or neither discriminate nor follow the object, according to line segment data which may be predetermined and represent a plurality of points of coordinates.

BRIEF DESCRIPTION OF DRAWINGS

In order that the present invention may be better understood, preferred embodiments thereof will be described with reference to the accompanying drawings, in which:

FIG. 1 shows initiating directions of an optical head having a sensor when the drive of the optical head is changed from a process according to the line segment data to a process according to the signals picked up by the sensor;

DESCRIPTION OF PREFERRED EMBODIMENTS

Figure 3:
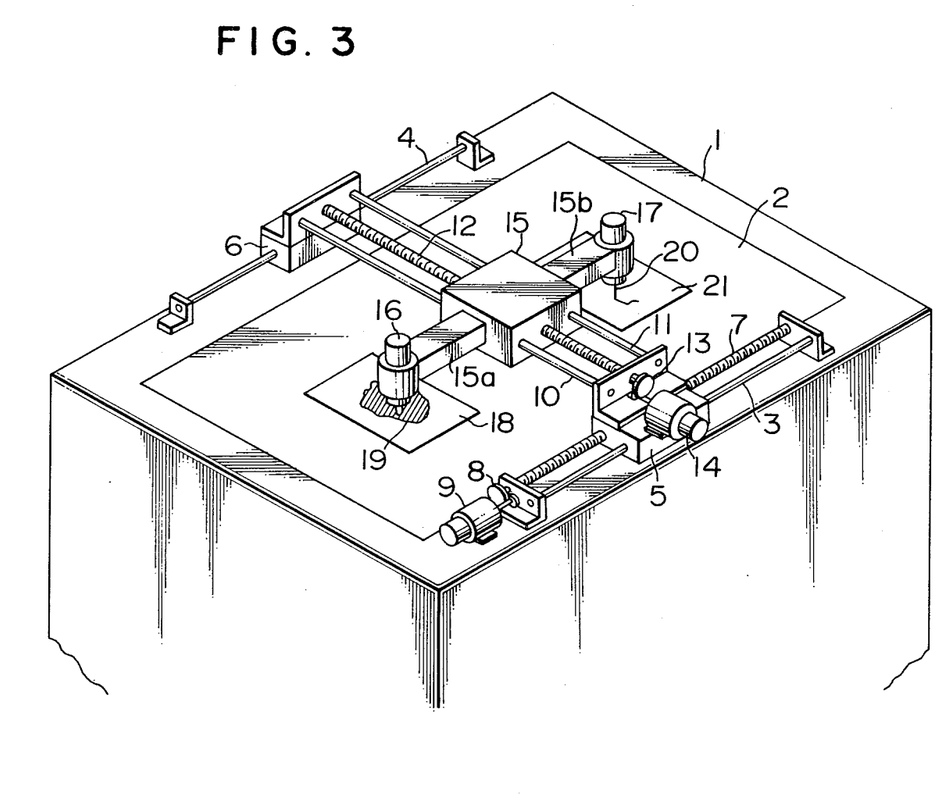
FIG. 3 is a perspective view of a conventional machine which can be used to practice a method of the present invention.

Referring to the drawings there is shown in FIG. 3 a conventional machine which can trace an outline of a picture according to a method of the present invention. On a frame 1 is mounted a piece of frosted glass 2, which is illuminated by a light source underneath it and not shown. A pair of guide rails 3 and 4 are fixed on opposite sides of the frame 1 in parallel, and on these guide rails slide sliders 5 and 6, respectively. Between the sliders 5 and 6 extend a second pair of guide rails 10 and 11, which are parallel, and on these guide rails 10 and 11 slides a carriage 15, which therefore is movable over the glass 2 in both the X- and Y-directions. Movement of the carriage in the one direction is controlled by a motor 9 which, via gears 8, drives a screw rod 7 which propels the slider 5 along the guide rail 3. Movement of the carriage 15 in the other, orthogonal, direction, is controlled by a motor 14, mounted on the assembly of the sliders 5 and 6 and the guide rails 10 and 11, which, via gears 13, drives a screw rod 12 which propels the carriage 15 along the guide rails 10 and 11. From the carriage on its two sides project two arms 15a and 15b. The arm 15a carries an optical head 16 at its end, facing downwards towards the glass 2, and the arm 15b carries a recording head 17 at its end, again facing downwards towards the glass 2.

Thus, the optical head 16, which acts as a tracing head, follows the outline 19 of the picture 18, and the recording head 17, which cuts the mask, move always together, being physically both mounted on the carriage 15. The recording head 17 has a heat pen 20, and is adapted to melt and cut the color film layer of a peel-off film 21. The optical head 16 includes a sensor composed of a number of photoelectric elements, and is adapted to detect variations in the light received by it.

The machine whose structure is described above is essentially the same as the one desclosed in U.S. Pat. Application Ser. No. 930,382, now U.S. Pat. No. 4,300,170 and United Kingdom Patent Laying-Open Publication No. 2,006,426 A, in regard to the sliders 5 and 6, the drive means for them, and the optical and recording heads. However, the machine therein described was provided with further manual means for moving the carriage, independently, in the X- and the Y-directions, and these two sorts of movement, manual and the automatic movement provided by the drive means, operated together so as to trace the picture outline in a particular manner.

Figure 4:
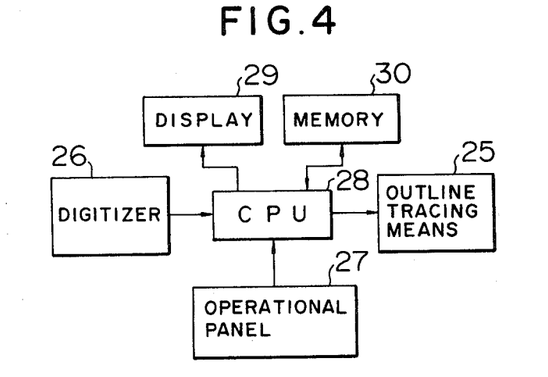
FIG. 4 is a block diagram of a system for performing a method of the present invention.

In FIG. 4, there is shown a block diagram of a system for performing a method of the present invention, comprising an outline tracing means 25, as shown in FIG. 3, a digitizer 26, an operational panel 27 on which switches and so forth for operating the tracing and the recording are arranged, a central processing unit 28, hereinafter referred to as CPU for short, a display 29 on which the operation process and order are displayed, and a memory 30 wherein line segment data which is picked up by using the digitizer 26 and which represents the portions of the outline, which the sensor included in the optical head 16 of the outline tracing means 25 can discriminate hardly or not at all nor follow the outline, is stored together with the operation process and order via the CPU 28 in advance.

Figure 5:
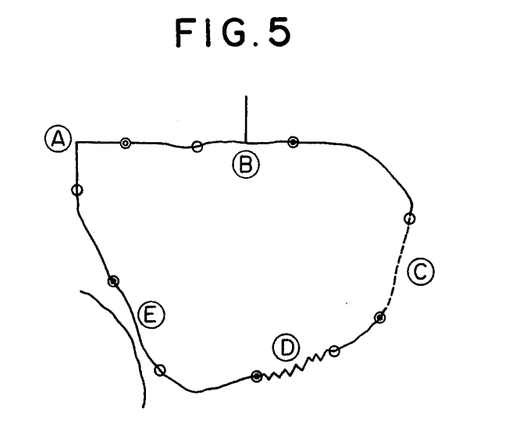
FIG. 5 shows an example of an outline to be traced according to the present method.

In FIG. 5 is shown an example of an outline to be traced according to the present method, wherein the portions which the sensor of the optical head 16 can discriminate hardly or not at all nor follow the outline, such as a corner portion (A), an intersecting portion (B) of the boundary of the different light values, a small light value difference portion (C), a small detail portion (D), and a portion (E) close to another outline, are included.

A method of the present invention for tracing an object such as an outline of the picture shown in FIG. 5 will be described with reference to FIGS. 6–8.

Figure 6:
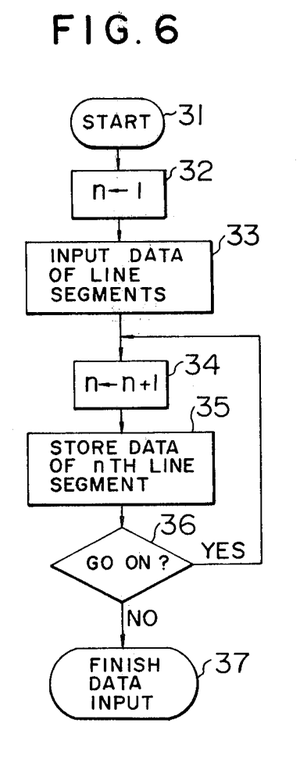
FIG. 6 shows a flow chart of a method for writing line segment data into a memory.

In FIG. 6 is shown a flow chart of a method for writing line segment data into the memory 30. The digitizer 26 is actuated to start in a step 31, and the number of the line segment whose coordinates are to be stored into the memory 30 is set by "n". Then, "n" is set to "1" in step 32, and the first line segment of the corner portion (A) of the outline of FIG. 5 is traced manually on the digitizer 26 from the single circle to the double circle to obtain first line segment data representing a line of continuous points of coordinates, which is to be stored into the memory 30 via the CPU 28 in a step 33.

In this case, the original picture whose outline is to be traced, is positioned on the digitizer 26 by using register pins thereon, which have a determined relation with register pins for positioning the original picture when it is mounted on the outline tracing means 25.

Then, n+1, i.e. "2" is given to "n" in a step 34, and the second line segment of the intersecting portion (B) of the outline is followed manually on the digitizer 26 in the same manner as the first line segment in a step 34, to obtain second line segment data which is to be stored into the memory 30 in the same manner as the first line segment data in a step 35.

Then, it is determined whether more line segments to be traced for obtaining the line segment data exist, or not, in a step 36. When this answer is "YES", i.e. more line segments exist, the process is returned to the step 34, and the same operation as above is repeated while "n" is increased by one. In this embodiment shown in FIG. 5, three more line segments to be traced, that is, the small light value difference portion (C), the small detail portion (D), and the another outline close portion (E), are repeatedly processed in the same manner as the second line segment, thereby storing the third, the fourth and the fifth line segment data into the memory 30 via the CPU 28.

On the other hand, when the answer is "NO" in the step 36, i.e. no more line segments exist, the writing of the line segment data into the memory 30 is finished in a step 37.

Figure 7:
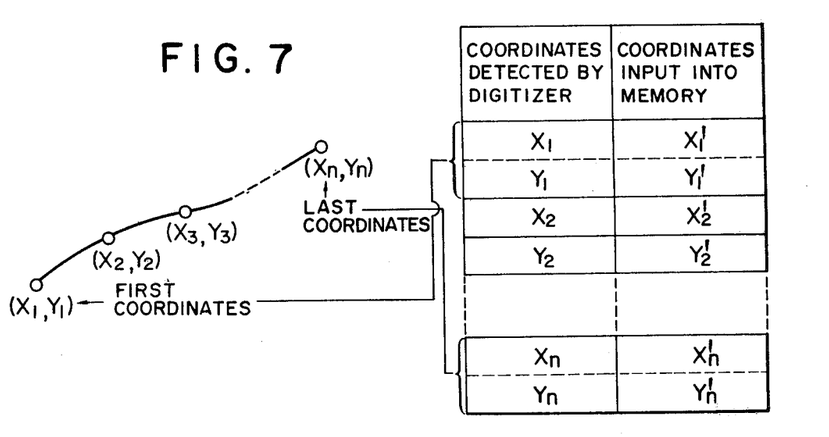
FIG. 7 shows schematically coordinates of line segments, and a graph of the coordinates to be stored in the memory.

In this embodiment, such line segment data is detected in a combination of a plurality of points of coordinates $(X_1,Y_1)$, $(X_2,Y_2)$, ..., $(X_n,Y_n)$, as shown in FIG. 7, and then the detected coordinates values are converted by the CPU 28 into the corresponding coordinates $(X_1',Y_1')$, $(X_2',Y_2')$, ..., $(X_n',Y_n')$ on the table, or the frosted glass 2 of FIG. 3, of the outline tracing means 25 on which the original picture is mounted. The converted coordinates values are consecutively stored as the line segment data into the memory 30.

Figure 8:
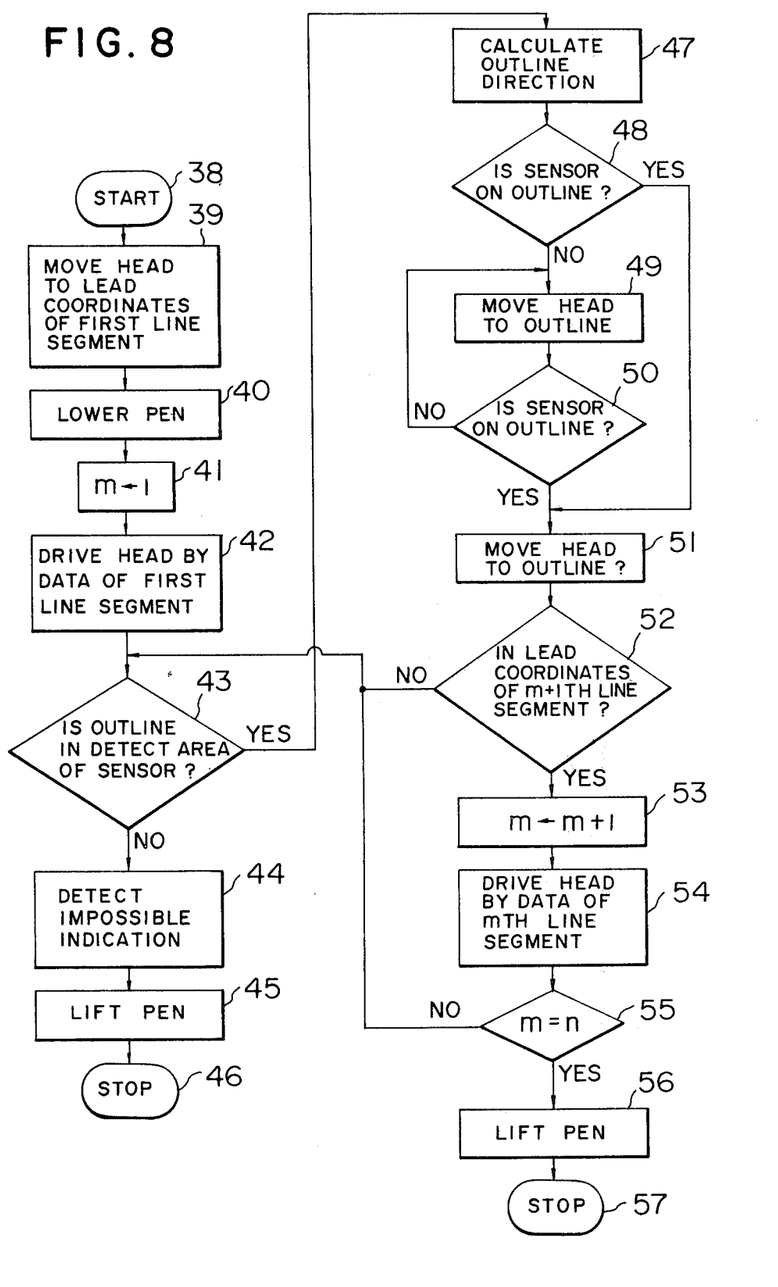
FIG. 8 shows a flow chart of a method for tracing and recording an outline of a picture according to the present invention.

When the writing of all line segment data of the portions of the outline, which the sensor of the optical head 16 can neither discriminate hardly or not at all nor follow the outline, into the memory 30 is finished, the operator then transfers the original picture from the digitizer 26 onto the table of the outline tracing means 25 and mounts it, and thereafter the tracing of the outline of the original picture is carried out by operating the outline tracing means 25 according to the process shown in FIG. 8.

First, the outline tracing means 25 is switched on in order to start it in a step 38. Then, the optical head 16 is moved from the starting position to the first coordinates corresponding to the first line segment data stored in the memory 30 in a step 39, and, when the optical head 16 is reached the position corresponding to the first coordinates of the first line segment data, the heat pen 20 of the recording head 17 is lowered onto the recording material such as the peel-off film 21 mounted to the frosted glass 2 of the outline tracing means 25 in a step 40.

Then, "m" is set to "1" in a step 41, and, when the optical head 16 is moved along the first line segment according to the first line segment data to a position which is within a certain distance around and before the position corresponding to the last coordinates of the first line segment data, the optical head 16 is once stopped there in a step 42.

Then, the sensor of the optical head 16 is actuated to determine whether the outline 19 of the picture is positioned within the sensing area of the sensor, or not, in a step 43. This step is carried out for the following reason. That is, when the accuracy of the operation for obtaining the line segment data by using the digitizer 26 by the operator is very bad, the outline 19 to be traced is often positioned outside the sensing area of the sensor. In such a case, an impossible detection is indicated in the display 29 in a step 44, the heat pen 20 is lifted from the film 21 in a step 45, and the operation of the outline tracing means 25 is stopped in a step 46.

When it is confirmed that the outline 19 is positioned within the sensing area of the sensor of the optical head 16 in the step 43, the direction of the outline 19 is obtained by a calculation in a conventional manner, as disclosed in the U.S. Pat. No. 4,300,170 and the United Kingdom Patent Laying-Open Publication No. 2,006,426 A, in a step 47, and then it is determined whether the center of the sensor is positioned on the outline 19.

When it is confirmed that the center of the sensor is positioned on the outline 19 in the step 48, the optical head 16 is moved along the outline 19 in a step 51, and, in the same time, the heat pen 20 of the recording head 17 records the line segment corresponding to the outline traced onto a peel-off film 21 in synchronization with the optical head 16.

When it is found that the center of the sensor is positioned off the outline 19 in the step 48, the optical head 16 is driven to move to the outline 19 in a step 49, and then it is determined again whether the center of the sensor is positioned on the outline 19, or not, in a step 50, alike the step 48. When the center of the sensor is positioned off the outline 19, return to the step 49 and the steps 49 and 50 are repeated. When the center of the sensor is positioned on the outline 19, the optical head 16 is moved along the outline 19 in the step 51, as described above.

Then, when the optical head 16 reaches a predetermined area including a position corresponding to the starting coordinates of the following line segment data m+1, i.e. now, the second line segment data, it is determined whether the center of the sensor is positioned within the predetermined area, or not, in a step 52.

When the center of the sensor is not positioned within the predetermined area, the process is returned to the step 43, and the steps 43–52 are repeated, as described above. When the center of the sensor is positioned within the predetermined area, the optical head 16 is moved so that the center of the sensor may be positioned in the position corresponding to the starting coordinates of the second line segment data.

Then, when the center of the sensor coincides with the starting coordinates of the second line segment data, "m" is set to "1" in a step 53, and the optical head 16 is moved according to the second line segment data in a step 54.

Thereafter, it is determined whether the number of "m" presently processed is the same as that of the line segment data (five in the embodiment of FIG. 5), or not, in a step 55. When the two numbers are not coincident, the procedure goes back to the step 43, and the steps 43–55 are repeated as described above. When the two numbers are coincident, the heat pen 20 of the recording head 17 is lifted from the film 21, and then the recording of the outline tracing is stopped or finished.

In the embodiment shown in FIG. 5, the outline recording process is finished at the last coordinates corresponding to the last line segment data of the last line segment (E) according to the flow chart of FIG. 8. However, the outline recording process may be continued to the first coordinates corresponding to the first line segment data of the first line segment (A), thereby obtaining "an outline finish mask" of a closed loop.

In this embodiment, when the last coordinates corresponding to the last line segment data are not positioned on the outline 19 and are within the sensing area of the sensor, the optical head 16 is moved to the outline 19, so that the center of the sensor may be positioned on the outline 19, and then the optical head 16 is controlled to be moved along the outline by the sensor. However, the optical head 16 moves along the shortcut, and hence the line form difference between the outline to be traced and the outline recorded is partly outstanding, which should be improved. According to the present invention, this improvement is performed as follows.

Figure 9:
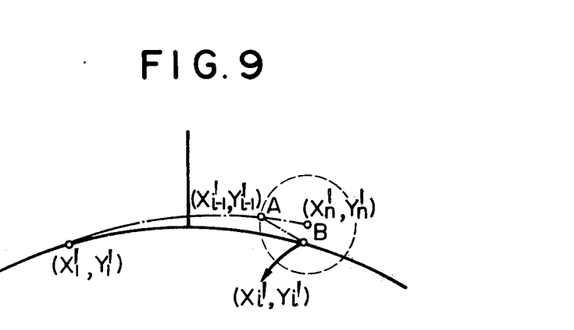
FIGS. 9 and 10 show examples for recording the outline according to the present method.

In FIG. 9 there is shown a line segment by a dash-dot line, corresponding to coordinates of line segment data stored in the memory 30 together with an actual outline shown by a solid line. Since an end point B corresponding to the last coordinates $(X_n',Y_n')$ of the line segment data, which is off the outline, is positioned within the sensing area, shown by a dashed line, of the sensor, the optical head 16 is moved to the outline. If the optical head 16 is moved from the point corresponding to the last coordinates $(X_n',Y_n')$ of the line segment data to a destination point corresponding to coordinates $(X_i', Y_i')$ on the outline, the line shape difference between the actual and recorded lines is extraordinary. The improvement is carried out in the followings.

In this case, while the lowered heat pen 20 records the film 21, the optical head 16 is moved from a point corresponding to the first coordinates $(X_l',Y_l')$ of the line segment data towards the point corresponding to the last coordinates $(X_n',Y_n')$ along the one-dotted line. When the center of the sensor arrives at a point A corresponding to coordinates $(X_{i-l}', Y_{i-l}')$ which are predetermined within the sensing area of the sensor and are stored in the memory 30, the heat pen 20 is lifted from the film 21, and then the optical head 16 is moved to the point corresponding to the coordinates $(X_n',Y_n')$ of the line segment data. Then, the sensor is actuated, and the optical head 16 is moved from the point corresponding to the coordinates $(X_n',Y_n')$ onto the outline via the shortcut by the sensor actuated. The intersect coordinates $(X_i', Y_i')$ of the shortcut with the outline are detected by the sensor and are stored into the memory 30.

Then, the optical head 16 is returned to the position corresponding to the coordinates $(X_{i-l}', Y_{i-l}')$, and the heat pen 20 of the recording head 17 is lowered onto the film 21. Then, the optical head 16 is moved linearly from the position corresponding to the coordinates $(X_{i-l}',Y_{i-l}')$ to the position corresponding to the corresponding to the coordinates $(X_i',Y_i')$ while the heat pen 20 records the outline on the film 21.

Therefore, the outline recorded by the heat pen 20 of the recording head 17 is shown by a dash-dot-dot line in FIG. 9 wherein the coupling portion between the last part recorded according to the line segment data and the first part recorded by the sensor is smoothed very much, thereby improving very much the line form difference between the actual and the recorded lines.

Such a smoothing process of the coupling portion can, of course, be applied to the coupling portion between the first part to be recorded according to the line segment data and the last part recorded by the sensor.

Figure 10:
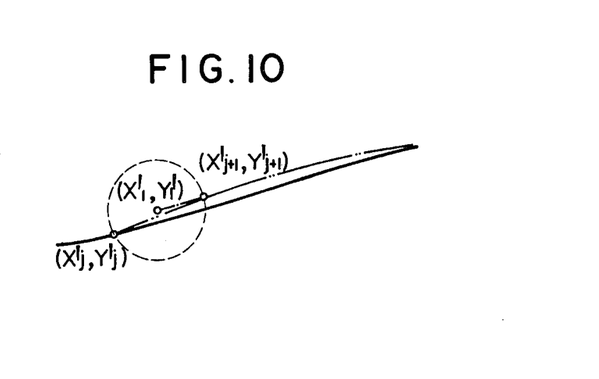

Another smoothing process will be described in connection with FIG. 10. When a position corresponding to the first coordinates $(X_l',Y_l')$ of the line segment data is not positioned on the actual outline shown by a solid line, and the center of the sensor is positioned within an area, shown by a broken line, predetermined around the first coordinates $(X_l',Y_l')$, the sensor is not operated, and the optical head 16 is moved along a line which passes through points having coordinates $(X_j',Y_j')$ and $(X_{j+l}',Y_{j+l}')$ which are intersections of the periphery of the predetermined area with the outline and the line segment, thereby improving very much the line form difference between the actual and the recorded lines.

In the embodiments of the present invention, when the drive of the optical head 16 is changed from a process according to the line segment data to a process according to the sensor, for example, the initial moving direction of the sensor is determined from the coordinates $(X_{i+l}',Y_{i+l}')$ and $(X_n',Y_n')$. Hence, no other coordinates for determining the tracing direction of the sensor is required even when the outline to be traced is largely curved.

Figure 11:
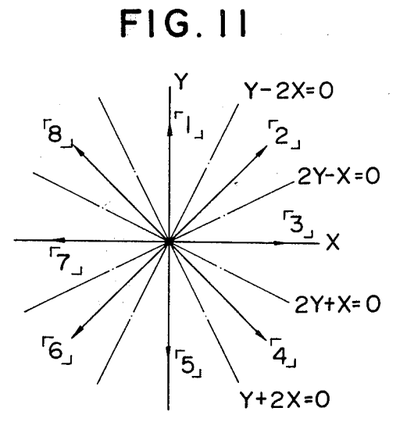
Figure 12:
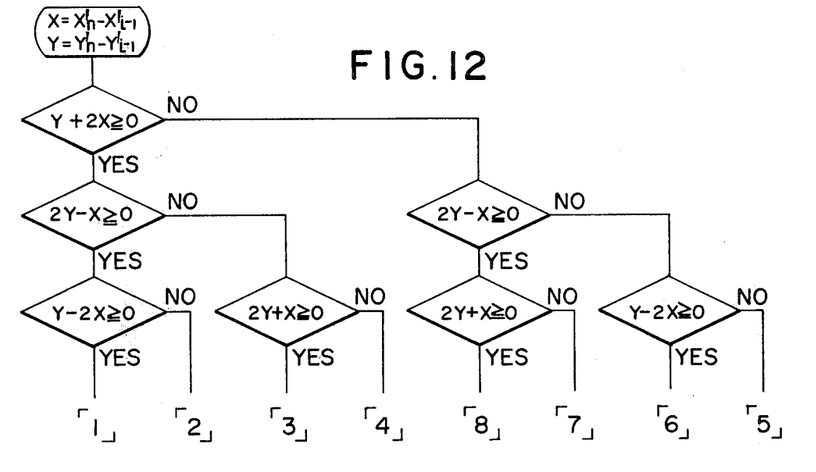
FIG. 12 shows a flow chart of a method for determining the initiating directions of the optical head.

When the drive of the optical head 16 is changed from the process according to the line segment data to the process according to the sensor in FIG. 9, the initial moving direction of the sensor is determined as follows. In FIG. 11, eight directions "1"–"8⇄", with "3", "7","1" and "5" being the $+X$, $-X$, $+Y$ and $-Y$ directions, respectively are radially set around the origin as initial moving directions of the sensor, as shown by arrows, and border lines which satisfy equations $Y-2X=0$, $2Y-X=0$, $2Y+X=0$, and $Y+2X=0$, are set between each two adjacent directions. The direction of the line passing through the two points $A(X_{i-l}',Y_{i-l}')$ and $B(X_n',Y_n')$ of FIG. 9 is determined by calculating equations, i.e. $X=X_n'-X_{i-l}'$, and $Y=Y_n'-Y_{i-l}'$, and then from the values X and Y obtained, it is determined in which area of the eight divided by the four equations, i.e. $Y-2X=0$, $2Y-X=0$, $2Y+X=0$, and $Y+2X=0$, the line passing through the two points A and B is included, according to a flow chart shown in FIG. 12, thereby obtaining the initial moving direction of the sensor. In the flow chart of FIG. 12, the values $X=X_n'-X_{i-l}'$, and $Y=Y_n'-Y_{i-l}'$ are first determined by the equation $Y+2X\geq 0$ to obtain two first results "YES" and "NO", and each first result is further determined by the equation $2Y-X\geq 0$ to obtain four second results "YES" and "NO". Then, each second result is determined by the equation $Y-2X\geq 0$ or $2Y+X\geq 0$ to obtain eight third results "YES" and "NO", thereby determining the initial moving direction of the sensor; "1", "2", "3", "4", "5", "6", "7", or "8".

From the above description, the outline of the object such as the original picture is recorded by the combination of the processes according to the output signals picked up by the sensor and according to the line segment data obtained by using the outline tracing means by utilizing the advantages of the two processes, thereby obtaining a cut mask for photo-copying, and the like. According to the present method, the tracing and recording to a line image of a cartoon, a line drawing pattern, or the like can be easily carried out.

Figure 13:
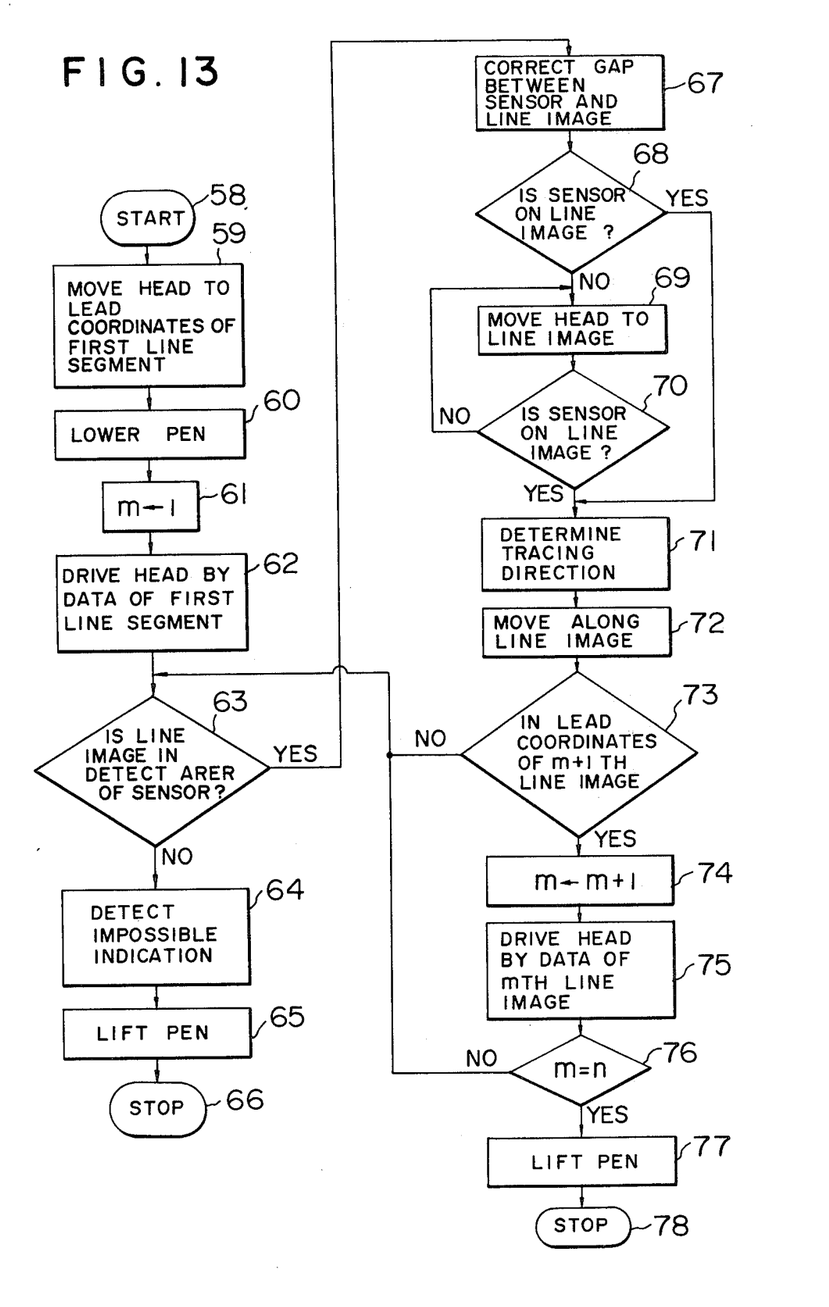
FIG. 13 shows a flow chart of a method for tracing and recording a line image according to the present invention.

In FIG. 13 there is shown a flow chart of a method for tracing and recording a line image according to the present invention, which is almost the same as that of FIG. 8, that is, steps 58–62, 64–66, and 74–78 are the same as the steps 38–42, 44–46, and 53–57 of FIG. 8, except steps 63, 67–73, and therefore the explanation of the same steps will be omitted for the brevity of the description.

When the optical head 16 reaches the position which is at a certain distance away and prior to the position corresponding to the last coordinates of the first line segment data, the optical head 16 is once stopped there in the step 62. Then, the sensor of the optical head 16 is actuated to determine whether the line image is positioned within the sensing area of the sensor, or not, in the step 63.

When the line image to be traced is positioned outside the sensing area of the sensor, the impossible detection is displayed in the display 29 in the step 64, the head pen 20 is lifted from the film 21 in the step 65, and the outline tracing operation is stopped in the step 66, in the same manner as the steps 44–66 of FIG. 8. When it is confirmed that the line image is positioned within the sensing area of the sensor in the step 63, the gap between the center of the sensor and the center of the line image is corrected in the step 67. Then, it is determined whether the center of the sensor is coincident with the center of the line image, or not, in the step 68.

When the center of the sensor is coincident with the center of the line image, the process is followed to the step 71. On the other hand, when the center of the sensor is not coincident with the center of the line image, the optical head 16 is driven so as to correct the gap between the center of the sensor and the center of the line image in the step 69, and then it is determined again whether the center of the sensor is coincident with the center of the line image, or not, in the step 71. When the center of the sensor is not coincident with the center of the line image, the process is returned to the step 69, and the steps 69 and 70 are repeated. When the center of the sensor is coincident with the center of the line image, the process goes on to the step 71. In the step 71, the tracing direction for the line image is determined.

When the outline of the picture is traced by means of the sensor, the tracing direction of the outline is determined by detecting the position of the dark or the light part of the two different density parts with respect to the sensor in a conventional manner. However, when the line image is traced by the sensor, such a conventional method cannot be employed, and accordingly, in this case, the tracing direction of the sensor is mincingly determined whenever the optical head 16 is moved at a very small distance.

Figure 14:
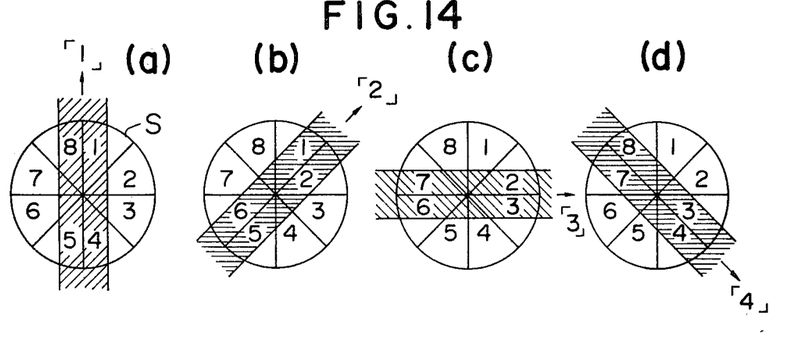
FIGS. 14a, 14b, 14c and 14d show directions of the line image, detected according to the signals picked up by the sensor.

In this embodiment, four directions (eight directions if the reverse direction of each direction is added), at each angle 45° between the two adjacent directions, for tracing the line image by the sensor are settled, as shown in FIG. 14 with respect to the sensor S composed of the eight photoelectric sector-shaped elements "1"–"8". The extending direction of the line image is first detected, as hereinafter described. Then, the extending direction detected is compared with the initial direction of the sensor, and the moving direction of the sensor, and the moving direction of the optical head 16 for tracing the line image is determined depending on the comparison result by means of the sensor.

In order to detect the extending direction of the line image to be traced, first, output signal values $E_1$–$E_8$ picked up by the photoelectric elements "1"–"8" of FIG. 14 are calculated according to the following equations I–IV wherein $T_1$–$T_4$ are calculation results.

$$E_1+E_2-E_3-E_4+E_5+E_6-E_7-E_8=T_4 \quad \text{(I)}$$

$$E_8+E_1-E_2-E_3+E_4+E_5-E_6-E_7=T_3 \quad \text{(II)}$$

$$E_7+E_8-E_1-E_2+E_3+E_4-E_5-E_6=T_2 \quad \text{(III)}$$

$$E_6+E_7-E_8-E_1+E_2+E_3-E_4-E_5=T_1 \quad \text{(IV)}$$

Then, the maximum value (or the minimum value when the line image is negative and is drawn in the white color in the dark background) of the four calculation values $T_1$–$T_4$ is selected, and then the extending direction of the line image is so determined, for example, that, when $T_1$ is the maximum, it is "1", when $T_2$ is the maximum, it is "2", when $T_3$ is the maximum, it is "3", or when $T_4$ is the maximum, it is "4", as shown in FIGS. 14a, 14b, 14c and 14d.

Thus the obtained number of the extending direction of the line image is compared with the number of the initial moving direction of the sensor, that is, the difference of the two numbers is calculated. When the difference is 0 or ±1, the extending direction of the line image is made to be the tracing direction of the optical head 16 by means of the sensor. When the difference is ±3, ±4 or ±5, the reverse direction of the extending direction of the line image is let to be the tracing direction of the optical head 16. When the difference is ±2 or ±6, the extending direction of the line image is perpendicular to the tracing direction of the optical head 16, and thus the tracing direction of the optical head 16 is not determined. On this occasion, on the display 29 "SOFT ERROR" is displayed, and the outline tracing means 25 is once stopped.

The tracing directions of the optical head 16, obtained from the initial moving directions of the sensor and the extending directions of the line image is described above, are tabulated as below.

TABLE

| EXTENDING DIRECTION | INITIAL DIRECTION | | | | | | | |
|---|---|---|---|---|---|---|---|---|
| | 1 | 2 | 3 | 4 | 5 | 6 | 7 | 8 |
| 1 | 1 | 1 | SOFT ERROR | 5 | 5 | 5 | SOFT ERROR | 1 |
| 2 | 2 | 2 | 2 | SOFT ERROR | 6 | 6 | 6 | SOFT ERROR |
| 3 | SOFT ERROR | 3 | 3 | 3 | SOFT ERROR | 7 | 7 | 7 |
| 4 | 8 | SOFT | 4 | 4 | 4 | SOFT | 8 | 8 |

| EXTENDING | INITIAL DIRECTION | | | | | | | |
|---|---|---|---|---|---|---|---|---|
| DIRECTION | 1 | 2 | 3 | 4 | 5 | 6 | 7 | 8 |
| | ERROR | | | | ERROR | | | |

Hence, the tracing direction of the optical head 16 is determined according to the table. This determination of the tracing direction of the optical head 16 is carried out in the step 71 of FIG. 13 for simplifying the explanation.

Then, the optical head 16 is moved along the line image in the step 72 in the similar way to the step 51 of FIG. 8. Then, the optical head 16 comes in a predetermined area including a position corresponding to the first coordinates of the next line segment data m+1, or the second line segment data, it is determined whether the center of the sensor is positioned within the predetermined area, or not, in the step 73. Thereafter, the following steps are processed in the same manner as those of FIG. 8, as described above, resulting in finishing of the tracing and the recording of the outline.

In this embodiment, the width of the line image is not always the same. When tracing a thick or thin width part of the line image, the tracing direction of the optical head is often not determined. This problem is overcome as follows.

Figure 15:
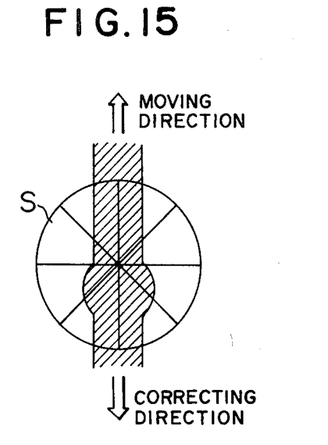
FIG. 15 shows one example of the line image whose correcting direction determined according to the signals picked up by the sensor is not coincident with the moving direction of the optical head.

As shown in FIG. 15, when the line image having a thick width part is traced, since the direction for correcting the gap between the actual and the recorded lines is the same as the initial moving direction determined of the optical head 16 whenever it is moved at a small distance, the optical head 16 traces the line image well before the center of the sensor passes the thick width part of the line image, but, after the center of the sensor passes the thick width part, the gap correcting direction becomes opposite to the initial moving direction of the optical head 16.

Then, in such a case, according to the present invention, the total values of the right and the left elements which are divided into two groups with respect to the gap correcting direction, are compared. When the difference is smaller than a predetermined value, the optical head 16 is moved to the opposite direction against the gap correcting direction. When the difference is larger than the predetermined value, the optical head 16 is moved to the gap correcting direction as the center of the sensor is considered to be off the center of the line image.

Although the present invention has been described with reference to preferred embodiments thereof, however, various changes and modifications can be made by those skilled in the art without departing from the scope of the present invention.

For example, the number of the photoelectric elements composing the sensor is not restricted to eight, other number is, of course, applicable to the present invention, as disclosed in United Kingdom Patent Laying-Open Publication No. 2,006,426 A. Further, arrangement of the photoelectric elements is not restricted to the radial one, other arrangement may be practicable as far as the position and the direction of the outline or the line image to be traced can be detected from the output signals picked up by the elements.

Furthermore, according to the present invention, instead of the heat pen for recording the peel-off film as the recording material, other recording means can be used depending on other recording materials such as paper sheet, film, or the like.

What is claimed is:

1. A method for tracing an object wherein the object is sensed by a set of sensing elements included in an optical head which moves along the object, to detect a position and a direction of the object, wherein the optical head is controlled to trace the object depending on the detected position and the direction of the object, and wherein the object is reproduced by reproduction means which is moved in synchronization with the optical head, the improvement comprising the step of moving the optical head along portions of the object, which the sensing elements can discriminate hardly or not at all nor follow the object, according to line segment data which are stored previously by coordinate reading means and may be predetermined and represent a plurality of points of coordinates.

2. A method as defined in claim 1, wherein the object is an outline of a picture.

3. A method as defined in claim 1, wherein the object is a line image.

4. A method as defined in claims 1 or 3, wherein the extending direction of the line image, and the gap between the center of a sensor composed of the sensing elements and the center of the line image are obtained by calculating the output signals picked up by the sensing elements, and then the optical head is controlled to be moved along the portions by the values obtained.

5. A method as defined in claims 1, 2 or 3, wherein the line segment data corresponding to the portions of the object, which the sensing elements can discriminate hardly or not at all nor follow the object, are obtained by using a digitizer.

6. A method as defined in claim 4, wherein the line segment data corresponding to the portions of the object, which the sensing elements can discriminate hardly or not at all nor follow the object, are obtained by using a digitizer.

7. In the method for tracing an object comprising controlling an optical head having sensing elements to move along the object, the optical head being controlled to trace the object depending on the detected position and a direction of the object, and reproducing the object with reproduction means moved in synchronism with the optical head, the improvement comprising determining and storing line segment data with a coordinate reading means prior to said step of controlling, and employing said stored line segment data in combination with the outputs of said sensing elements of said optical head for controlling said optical head to trace at least portions of the object which the elements cannot discriminate or can discriminate with difficulty or cannot follow the object.

8. The method of claim 7 wherein said step of determining and storing line segment data comprises manually moving a digitizing device along said object to produce said line segment data which approximates determined contours of said object.

* * * * *

UNITED STATES PATENT AND TRADEMARK OFFICE
CERTIFICATE OF CORRECTION

PATENT NO. : 4,441,020

DATED : April 3, 1984

INVENTOR(S) : METHOD FOR TRACING AN OBJECT

It is certified that error appears in the above-identified patent and that said Letters Patent is hereby corrected as shown below:

Column 8, line 38, change "1"-"8 , to --"1"-"8",--.

Signed and Sealed this

Eighteenth Day of November, 1986

Attest:

DONALD J. QUIGG

*Attesting Officer*   *Commissioner of Patents and Trademarks*